(12) United States Patent
Omote et al.

(10) Patent No.: US 6,198,052 B1
(45) Date of Patent: Mar. 6, 2001

(54) CIRCUIT BOARD WITH TERMINAL ACCOMMODATING LEVEL DIFFERENCES

(75) Inventors: Toshihiko Omote; Yasuhito Ohwaki; Kenichiro Ito, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/227,267

(22) Filed: Jan. 8, 1999

(30) Foreign Application Priority Data

Feb. 19, 1998 (JP) ................................................ 10-037029

(51) Int. Cl.[7] .............................. H01R 12/04; H05K 1/11
(52) U.S. Cl. ............................................. 174/261; 174/255
(58) Field of Search ..................................... 174/255, 260, 174/261, 264, 265; 361/767, 777, 768, 769, 770, 771

(56) References Cited

U.S. PATENT DOCUMENTS

| 3,726,002 | * | 4/1973 | Greenstien et al. | 29/577 |
| 4,847,136 | * | 7/1989 | Lo | 428/195 |
| 4,979,074 | * | 12/1990 | Morley et al. | 361/386 |
| 5,305,519 | * | 4/1994 | Yamamoto et al. | 29/852 |
| 5,329,423 | * | 7/1994 | Scholz | 361/760 |
| 5,600,103 | * | 2/1997 | Odaira et al. | 174/265 |
| 5,943,212 | * | 8/1999 | Horiuchi et al. | 361/704 |
| 6,005,777 | * | 12/1999 | Bloom et al. | 316/766 |

FOREIGN PATENT DOCUMENTS

| 5-206620 | 8/1993 | (JP) . |
| 7-3663 | 1/1995 | (JP) . |

OTHER PUBLICATIONS

English language abstract of JP5–206620.

* cited by examiner

Primary Examiner—Jeffrey Gaffin
Assistant Examiner—Jeremy Norris
(74) Attorney, Agent, or Firm—McGuireWoods, LLP

(57) ABSTRACT

In a circuit board with a conductor circuit formed on an insulating layer, a covering is formed on the conductor circuit and a terminal is connected to the conductor circuit penetrating through the covering to obtain high reliability for the connection between the terminal of the electronic component mounted on the circuit board and that of the circuit board. There is provided a level difference of 3 μm or less between the surface of the covering and that of the terminal.

18 Claims, 5 Drawing Sheets

CIRCUIT BOARD WITH TERMINAL ACCOMMODATING LEVEL DIFFERENCES

BACKGROUND OF THE INVENTION

1. Field of the Invention

The present invention relates to a circuit board with a conductor circuit formed on an insulating layer, a covering formed on the conductor circuit and a terminal connected to the conductor circuit penetrating through the covering.

2. Description of the Related Art

In recent years, with development of high speed and sophistication of electronic appliances, micromachining of several shapes is required on a circuit board on which an electronic component such as a semiconductor element or magnetic head is mounted. It is not too much to say that the reliability of the electronic appliance depends on the machining accuracy.

Generally, a terminal for connecting an electronic component is installed on the circuit board. The terminal surface is made of copper (Cu), nickel (Ni), gold (Au), etc. The terminal on a conventional circuit board was manufactured in such a manner that the surface of the conductor circuit is subjected to a prescribed electrolytic metal plating and a covering having a through-hole is formed on the surface. Specifically, the terminal portion, as shown in FIG. 4, has a structure in which the metal-plating surface exposed from a through-hole 33 of the covering 3 constitutes a terminal surface. In FIG. 4, the surface of the terminal 8 is made of an electrolytic-plating Au thin film 7.

The terminal of an electronic component mounted on such a circuit board and that of the circuit board are generally connected to each other through a metallic ball.

However, at the terminal portion of a conventional circuit board as shown in FIG. 4, generally, there is a level difference 30 of 4 $\mu$m or more between the covering surface and the terminal surface (surface of the conductor circuit). The level difference corresponds to thickness of the covering. As shown in FIG. 5, presence of such a level difference may lead to poor connection between the terminal 32 of the electronic component 31 and the terminal 8 of the circuit board by the metallic ball 34. Namely, in FIG. 5, the metallic ball 34 is brought into contact with the terminal 8 of the circuit plate but not with the terminal 32 of the electronic component.

SUMMARY OF THE INVENTION

The present invention has been accomplished in order to solve the above problem, and intends to provide a circuit board which can provide high reliability for the connection between the terminal of an electronic component mounted on the circuit board and that of the circuit board. A circuit board comprising: an insulating layer; a conductor circuit formed on the insulating layer; a covering formed on the conductor circuit; and a terminal connected to the conductor circuit penetrating through the covering, wherein a level difference between a surface of the covering and a surface of the terminal is 3 $\mu$m or less.

DETAILED DESCRIPTION OF THE PREFERRED EMBODIMENTS

Figure 1:
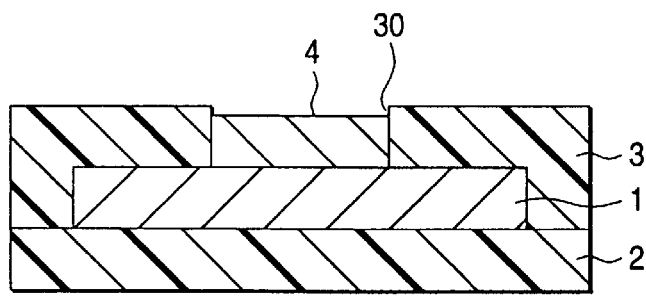
FIG. 1 is a sectional view showing the main part of one embodiment of the circuit board according to the present invention.

The circuit board according to the present invention is a circuit board with a conductor circuit 1 formed on an insulating layer 2, a covering 3 formed on the conductor circuit and a terminal 4 connected to the conductor circuit penetrating through the covering, wherein there is a very small level difference 30 between the surface of the covering and that of the terminal.

In the present invention, the level difference is 3 $\mu$m or less, preferably 2 $\mu$m or less, or ideally 1 $\mu$m or less.

Figure 2:
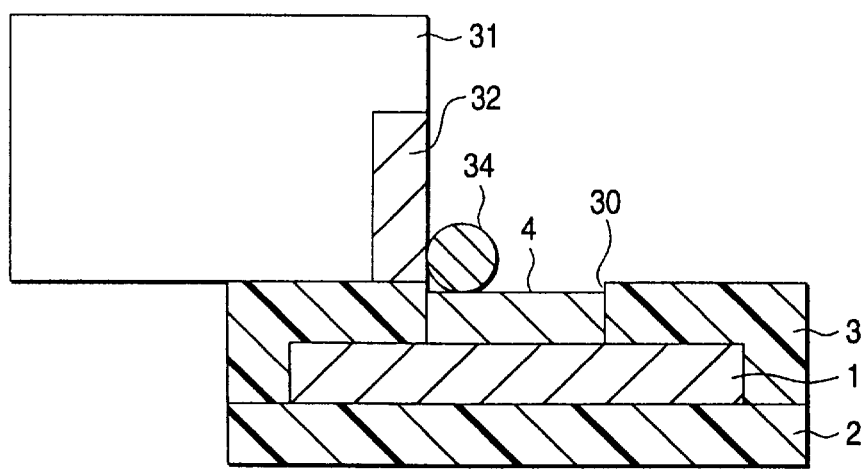
FIG. 2 is a sectional view showing the connection condition between the terminal of the circuit board according to the present invention and that of an electronic component.

As shown in FIG. 2, the terminal of an electronic component mounted on the circuit board according to the present invention and that of the circuit board are connected by means of a metallic ball 34. The metallic ball 34 are in kept in contact with both the terminal 32 of the electronic component and the terminal 4 of the circuit board.

The metallic ball may be made of solder, gold, etc., particularly preferably gold.

Generally, the connection between the terminals using the gold ball can be carried out by the gold ball bonding technique. Specifically, at the same time when the tip of a gold wire is brought into contact with the terminal portions of the circuit board and the electronic component, it is locally heated at a high temperature so as to be molten. The metallic ball thus formed is applied between both terminals. Thus, both terminals can be connected to each other.

The circuit board according to the present invention is particularly preferably used for the case where the terminal surface of the circuit board and that of the electronic component are in a vertical relationship.

The circuit board according to the present invention at least includes a structure in which the conductor circuit is installed on the insulating layer, and also includes a structure in which a metallic substrate 5 is further installed beneath the insulating layer 2.

In the present invention, the conductor circuit can be made of copper, aluminum, tungsten, but is made of normally copper.

The thickness of the conductor circuit is made of normally 1–50 $\mu$m.

In the present invention, the insulating film may be made of polyimide resin, polyester resin, or epoxy resin, preferably polyimide resin.

The thickness of the insulating film is made of normally 3–50 $\mu$m.

In the present invention, the covering formed on the conductor circuit may be made of polyimide resin, polyester resin, epoxy resin, etc. preferably polyimide resin.

The thickness of the covering is normally 1–25 µm, preferably 5–25 µm.

The covering and insulating layer may have the same material or same thickness.

Figure 3:
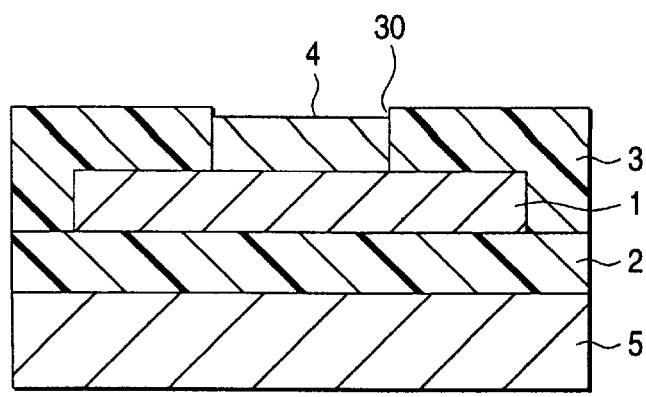
FIG. 3 is a sectional view showing the main part of one embodiment of the circuit board according to the present invention.

In the present invention, the metallic substrate formed on the insulating layer, as shown in FIG. 3, is made of stainless steel, phosphorus bronze, copper, preferably stainless steel.

The thickness of the metallic substrate is normally 5–50 µm.

An explanation will be given of a method of manufacturing a circuit board according to the present invention in connection with the circuit board in which the metallic substrate is formed beneath the insulating layer 2, as shown in FIG. 3.

For specific explanation, it is assumed that in FIG. 3, the conductor circuit 1 is made of copper, the insulating layer 2 and covering 3 are made of polyimide resin and the metallic substrate 5 is made of stainless steel. However, the method of manufacturing the circuit board according to the present invention should not be limited to such an assumption.

Figure 6:
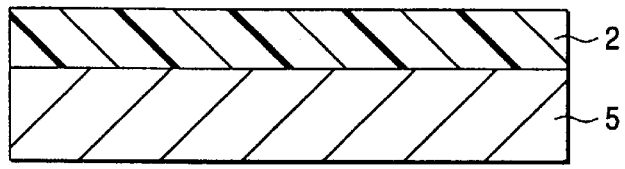
FIGS. 6 to 11 are sectional views of the circuit boards in respective steps showing a manufacturing process of the circuit board according to the present invention.

First, as shown in FIG. 6, an insulating layer 2 which is a film of polyimide resin is formed on a substrate 5 of stainless steel having any previously processed shape. The polyimide resin may be either thermosetting polyimide or photosensitive polyimide. In order to pattern the insulating layer, the photosensitive polyimide resin is preferred.

The insulating layer is patterned using the photosensitive polyimide resin in such a manner that precursor of the photosensitive polyimide is first applied on the entire surface of the substrate of stainless steel, and exposed to light through a predetermined photomask and developed.

Figure 7:
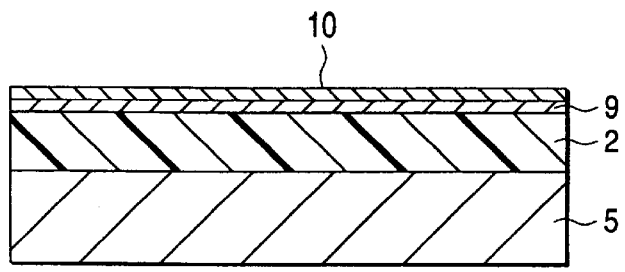

As shown in FIG. 7, a chromium (Cr) thin film 9 and a copper (Cu) thin film 10 are successively formed on the insulating layer 2.

Figure 8:
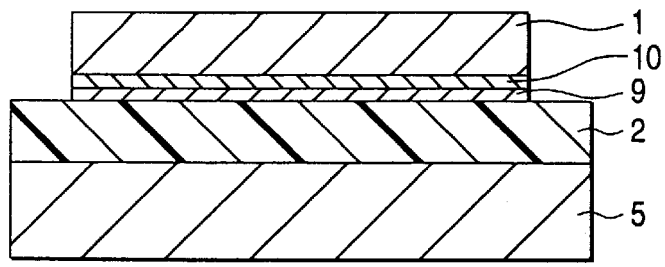

As shown in FIG. 8, the copper thin film 10 is electrolytic-plated with copper to provide a conductor circuit pattern 1 of copper.

The conductor circuit pattern can be formed in such a manner that resist having a reverse pattern thereto is first formed on the copper thin film, copper is electrolytic-plated on the exposed copper thin film and the resist is removed. After the resist has been removed, the unnecessary Cu thin film and Cr thin film other than the conductor circuit pattern are chemically etched away, and the conductor circuit pattern 1 is formed on the Cu thin film 10 as shown in FIG. 8.

The chemical etching of the Cu conductor layer and Cu thin film is preferably alkaline etching. In the chemical etching of the Cr thin film, for example, an etching liquid of potassium ferricyanide, potassium permanganate, sodium metasilicate, etc. is used.

Figure 9:
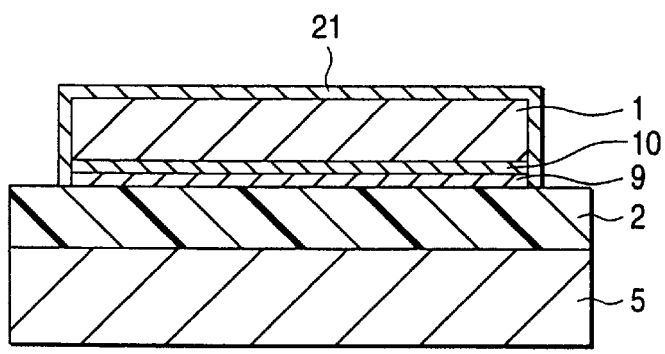

As shown in FIG. 9, the conductor circuit 1 is electroless-plated with Ni to cover its surface not in contact with the insulating layer with an electroless-plating Ni thin film 21. The electroless-plating Ni thin film 21 has an effect of preventing the ion migration in the conductor circuit.

Figure 10:
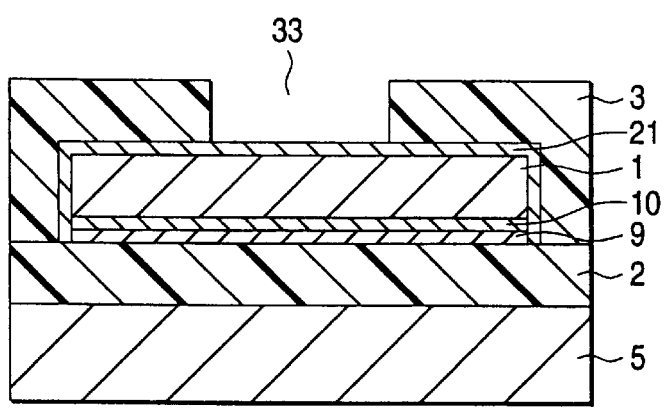

As shown in FIG. 10, a covering 3 of a polyimide resin layer is formed on the conductor circuit pattern 1 to cover its upper surface and side surface, and a through-hole 33 is formed at the area corresponding to the terminal.

The polyimide resin used for the covering may be either thermosetting polyimide resin or photosensitive polyimide resin. In the case of patterning the covering, the photosensitive polyimide resin is preferable.

The covering can be patterned using the photosensitive polyimide resin in the manner of patterning the insulating layer as described above.

Figure 11:
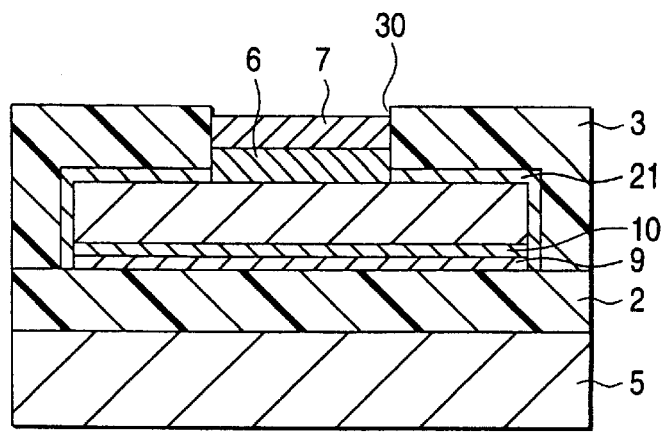

After the electroless-plating Ni thin film 21 exposed from the through-hole 33 is separated, electrolytic Ni plating and electrolytic Au plating are carried out successively so that an electrolytic-plating Ni thin film 6 and an electrolytic-plating Au thin film 7 are stacked. Thus, the terminal is formed to provide a level difference of 3 µm or less between the covering surface and the terminal surface, thereby providing a circuit board according to the present invention as shown in FIG. 11. The thickness of the electrolytic-plating metal thin film (height of the terminal) can be adjusted by controlling the time of electrolytic plating. Incidentally, FIGS. 3 and 11 show the circuit board having the same structure. However, in FIG. 3, the Cr thin film 9 and Cu thin film 10 formed by sputtering and the electroless-plating Ni thin film 21 covering the conductor circuit are not shown, and the electrolytic-plating Ni thin film 6 and electrolytic-plating Au thin film 7 are wholly shown as the terminal 4.

In the circuit board according to the present invention, the wiring width in the conductor circuit pattern is commonly 5–50 µm. It should be noted that the wiring width also includes the thickness of the metallic thin film formed on the surface of the conductor circuit by the electroless plating.

The interval between the wirings of the conductor circuit pattern is commonly 5–50 µm. It should be noted in the present invention that the wiring interval is not that in the conductor circuit before the metallic thin film is formed, but that in the conductor circuit after the metallic thin film is formed for wiring.

The circuit board according to the present invention may be either a rigid circuit board or a flexible circuit board.

Figure 12:
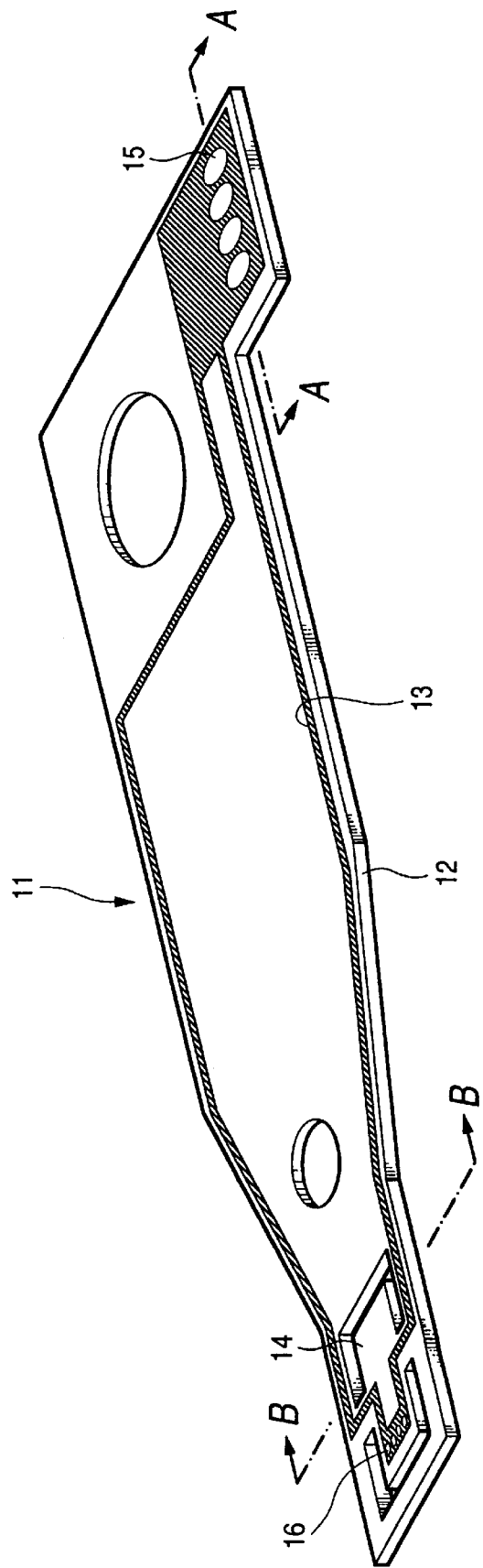
FIG. 12 is a perspective view showing one example of a suspension equipped with a circuit.

The circuit board according to the present invention can be applied to a suspension board 11 equipped with a circuit as shown in FIG. 12 used for a magnetic disk drive such as a hard disk drive, or applied to a circuit board equipped with a heat spreader for semiconductor packaging.

The terminals 15, 16 shown in FIG. 12 have the same structure as the terminal shown in FIG. 11 in which there is a level difference of 3 µm or less between the covering surface and the terminal surface.

An explanation will be given with respect to the structure of the suspension board 11 equipped with a circuit shown in FIG. 12. This suspension board 11 comprises a stainless steel substrate 12 having a predetermined shape, a conductor circuit pattern 13, terminals 15, 16, and a gimbal 14. The gimbal 14 is formed by cutting the stainless steel substrate 12, and the gimbal 14 is integrally formed with the stainless steel substrate 12. A magnetoresistive element (not shown) is fixed on the gimbal 14, and a terminal of the magnetoresistive element and the aforementioned terminal 16 is connected via the aforementioned metallic ball.

Figure 13:
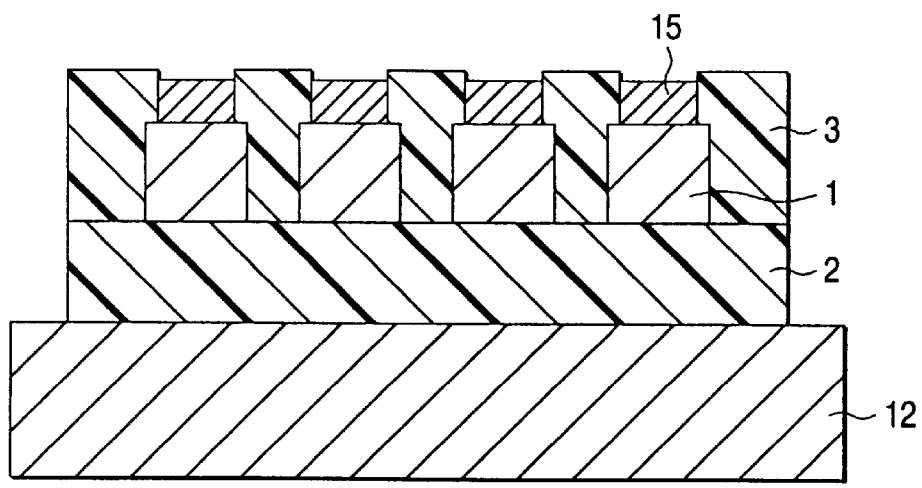
FIG. 13 is a sectional view taken along line A—A in FIG. 12.

FIG. 13 is a sectional view taken along line A—A in FIG. 12. The insulating layer 2 made of polyimide resin is formed on the stainless steel substrate 12, and the conductor circuit 1 as a thin film layer is formed on the insulating layer 2. Further, the terminal 15 is formed on the conductor circuit 1. All surfaces of the conductor circuit 1 covered and protected by the covering 3 except for the areas of the terminals 15.

Figure 14:
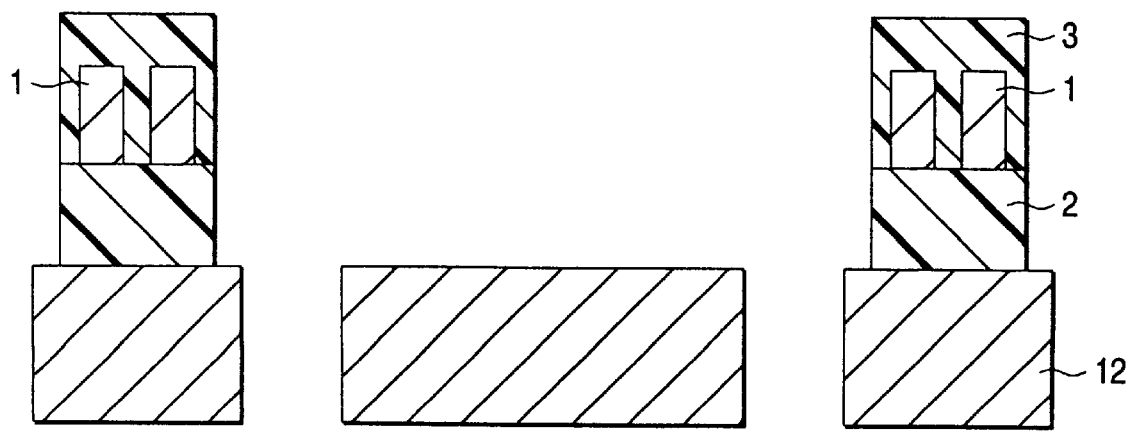
FIG. 14 is a sectional view taken along line B—B in FIG. 12.

FIG. 14 is a sectional view taken along line B—B in FIG. 12. The insulating layer 2 made of polyimide resin is formed on the stainless steel substrate 12, and the conductor circuit 1 as a thin film layer is formed on the insulating layer 2. All surfaces of the conductor circuit 1 is covered and protected by the covering 3.

In FIG. 12, each of the terminals 15 and 16 comprises four sets of unit terminals, and the four unit terminals are electrically connected via the four conductor circuits 1.

An explanation will be given of the present invention with respect to embodiments and comparative examples. However, the present invention should not be limited to the embodiments.

EMBODIMENT 1

P-phenylenediamine of 0.702 kg (6.5 mol), 3, 4, 3', 4'-biphenyltetracarboxylic acid dianhydride of 1.624 kg (5.5 mol), 2, 2 - bis (3, 4 - dicarboxyphenyl) hexafluoropropane of 0.444 kg (1.0 mol) (total quantity of acid anhydride is 6.5 mol) is solved in dimethylacetamide of 19.72 kg. The solution thus formed is stirred for 72 hours at room temperature. The solution is heated to 75° C. The heating is stopped when the viscosity reaches 5000 centipoise. The solution is left to room temperature and cooled. This solution is supplied with 4-o-nitrophenyl-3, 5-dimethoxycarbonyl-2, 6-dimetyl-1, 4-dihydropyridine of 0.9633 kg (2.78 mol), 4-o-nitrophenyl-3, 5-diacetyl-2, 6-dimetyl-1, 4-dihydropyridine of 0.6422 kg (2.04 mol) and imidazole of 0.161 kg (2.36 mol). Thus, the solution of the precursor of the photosensitive polyimide resin is adjusted.

The solution of the precursor of the photosensitive polyimide resin is applied to a substrate of a stainless steel (SUS304) having a thickness of 25 $\mu$m and previously processed into a prescribed shape. The structure thus formed is heated and dried for two minutes at 120° C. to complete the film of the photosensitive polyimide resin precursor. The structure is irradiated with ultraviolet rays having a dose of light exposure of 700 mJ/cm$^2$ through a mask, and heated at 160° C. for three minutes. The mask is developed to form a negative-type image. The structure is heated to 400° C. under vacuum of 0.01 Torr to form a patterned insulating layer of polyimide resin (having a thickness of 10 $\mu$m)

On the entire surface of the stainless steel with the insulating layer thereon, thin films of Cr and Cu having thicknesses of 500 Å and 1000 Å, respectively are formed by sputtering. The surface of the Cu thin film was 0.2–0.4 $\Omega$/□ (sheet resistance).

Thereafter, in accordance with the conventional technique, a dry film laminate which is commercially available is laminated on the Cu thin film. The laminate is exposed and developed with a dose of light exposure of 80 mJ/cm$^2$, thereby forming a resist having a reverse pattern to that of the conductor circuit which is an object.

After a right adhesive sheet serving as a plating mask is adhered to the back surface of the substrate of stainless steel, the Cu thin film exposed is electrolytic-plated with copper sulfate to form a conductor pattern plated with Cu having a thickness of 10 $\mu$m.

The unnecessary Cu thin film and Cr thin film other than the conductor circuit pattern are successively immersed in a mixed solution of potassium ferricyanide and sodium hydrozide at 30° C., and removed.

Thereafter, the structure is subjected to an ordinary electroless plating to form the Ni thin film having a thickness of 0.1 $\mu$m on the entire surface of the conductor circuit not in contact with the insulating film and the exposed surface of the substrate of stainless steel.

In the same manner as patterning the insulating layer, the covering of polyimide having a thickness of 3 $\mu$m is formed to provide a through-hole corresponding to the terminal on the conductor circuit pattern on the substrate of stainless steel using the photosensitive polyimide precursor.

Therefore, the substrate is immersed in a nitric acid separating agent at room temperature to remove the electroless-plating Ni thin film exposed from the above through-hole and at the unnecessary area other than the conductor circuit.

The electrolytic Ni plating and electrolytic Au plating are successively carried out in the through-hole and terminal area so that the terminal is formed so as to provide a level difference of 3 $\mu$m or less between the covering surface and the terminal surface. Thus, the circuit board as shown in FIG. 11 was obtained.

FIG. 11 shows the main part of the circuit board. Although a single wiring is shown, in this embodiment, actually four wirings are formed. The wiring width was set at 40 $\mu$m and the wiring interval was set at 30 $\mu$m.

EMBODIMENT 2

In the same fashion as in the first embodiment, a suspension substrate with a circuit of a hard disk drive as shown in FIG. 12 was manufactured.

COMPARATIVE EXAMPLE 1

In place of making the electroless Ni plating on the conductor circuit pattern, the electrolytic Ni plating and electrolytic Au plating were successively carried so that the electrolytic-plating Ni thin film and electrolytic-plating Au thin film were stacked.

Figure 4:
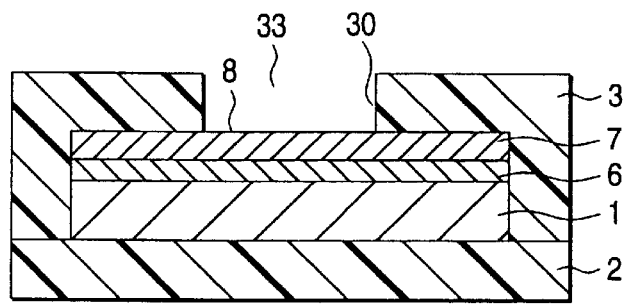
FIG. 4 is a sectional view showing the main part of one example of a circuit board according to the related art of the present invention.
Figure 5:
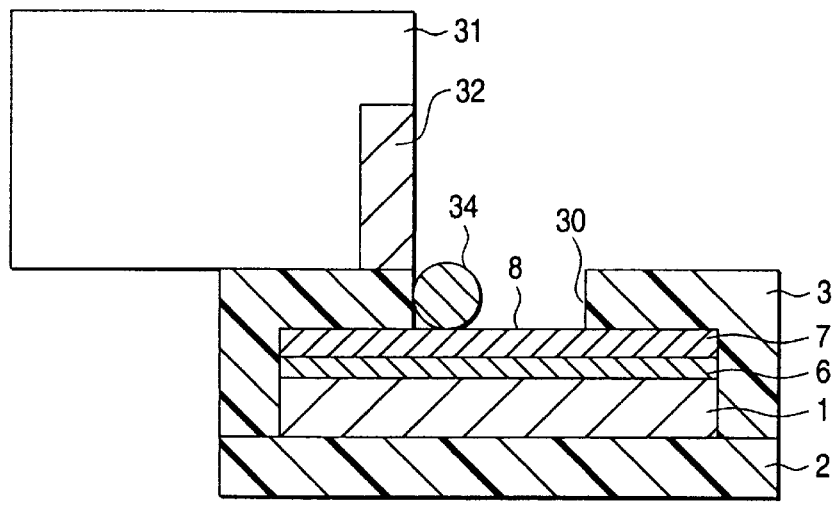
FIG. 5 is a sectional view showing the connection condition between the terminal and that of the electronic component according to the related art of the present invention.

On the electrolytic-plating Au thin film, like the first embodiment, the covering of polyimide resin having a thickness of 5 $\mu$m was formed to make the through-hole at the area corresponding to the terminal which was in turn formed. Thus, the circuit board as shown in FIG. 4 was obtained in which the electrolytic-plating Au thin film exposed from the through-hole constitutes a terminal surface.

COMPARATIVE EXAMPLE 2

In the same fashion as in the first comparative example, a suspension substrate with a circuit of a hard disk drive as shown in FIG. 12 was manufactured.

COMPARATIVE EXPERIMENT

A predetermined electronic component was mounted on each of 100 pieces of the circuit boards according to the first embodiment and first comparative example and 100 pieces of the suspension substrates equipped with the circuits according to the second embodiment and second comparative embodiment. Further, each of these circuit boards and the suspension substrates was subjected to the processing of connecting the terminals by the gold ball bonding technique (A magnetoresistive element was mounted on the suspension substrate equipped with the circuit according to the second embodiment and second comparative example).

As a result, in the circuit board according to the first embodiment and suspension substrate equipped with the circuit according to the circuit according to the second embodiment, the Au ball was kept in sure contact with the terminal of the circuit board, that of the suspension substrate equipped with the circuit and that of the electronic component. All of 100 pieces gave rise to no contact failure. On the other hand, two of 100 pieces of the circuit boards according to the first comparative example gave rise to contact failure of the Au ball being not in contact with the terminal of the electronic component. Further, two of 100 pieces of the suspension substrates equipped with the circuits according to the second comparative example gave rise to contact failure of the Au ball being not in contact with the terminal of the magnetoresistive element.

The circuit board according to the present invention is a circuit board with a conductor circuit formed on an insulating layer, a covering formed on the conductor circuit and a terminal connected to the conductor circuit penetrating through the covering. Because the level difference between the surface of the covering and that of the terminal is 3 μm or less, high reliability can be obtained for the connection between the terminal of the electronic component mounted on the circuit board and that of the circuit board.

What is claimed is:

1. A circuit board comprising:
   an insulating layer;
   a conductor circuit formed on said insulating layer;
   a cover formed on said conductor circuit having a first thickness; and
   a terminal connected to said conductor circuit penetrating through said covering and having a second thickness,
   wherein any difference between said first thickness and said second thickness provides a level difference between a surface of said covering and a surface of said terminal which is 3 μm or less.

2. A circuit board according to claim 1, further comprising a through-hole formed in said covering, and said terminal is formed in said through-hole and connected to an exposed portion of said conductor circuit which is exposed from said through-hole.

3. A circuit board according to claim 1, wherein said covering covers an upper surface and a side surface of said conductor circuit.

4. A circuit board according to claim 1, wherein said terminal is formed on said conductor circuit by electrolytic metal plating.

5. A circuit board according to claim 1, wherein said conductor circuit comprises at least one of the member selected from the group consisting of copper, aluminum and tungsten.

6. A circuit board according to claim 1, wherein a thickness of said conductor circuit is 1 to 50 μm.

7. A circuit board according to claim 1, wherein said insulating layer comprises at least one of the member selected from the group consisting of polyimide resin, polyester resin and epoxy resin.

8. A circuit board according to claim 1, wherein a thickness of said insulating layer is 3 to 50 μm.

9. A circuit board according to claim 1, wherein said covering comprises at least one of the member selected from the group consisting of polyimide resin, polyester resin and epoxy resin.

10. A circuit board according to claim 1, wherein a thickness of said covering is 1 to 25 μm.

11. A circuit board according to claim 1, further comprising a metallic substrate installed beneath said insulating layer.

12. A circuit board according to claim 11, wherein said metallic substrate comprises at least one of the member selected from the group consisting of stainless steel, phosphorus bronze and copper.

13. A circuit board according to claim 11, wherein a thickness of said metallic substrate is 5 to 50 μm.

14. A circuit board as recited in claim 11, further including a portion forming a gimbal.

15. A circuit board as recited in claim 1 wherein a connection is made to said terminal by a metallic ball.

16. A circuit board as recited in claim 15, wherein said metallic ball is a gold ball.

17. A circuit board as recited in claim 1, wherein said terminal comprises layers of metal.

18. A circuit board as recited in claim 17, wherein said layers of metal comprise layers of nickel and gold.

* * * * *